(12) United States Patent
Chen et al.

(10) Patent No.: US 11,864,653 B2
(45) Date of Patent: Jan. 9, 2024

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 0 days.

(21) Appl. No.: 18/088,219

(22) Filed: Dec. 23, 2022

(65) Prior Publication Data

US 2023/0128515 A1 Apr. 27, 2023

Related U.S. Application Data

(63) Continuation of application No. 17/034,574, filed on Sep. 28, 2020, now Pat. No. 11,607,040.

(30) Foreign Application Priority Data

Jun. 30, 2020 (TW) .................................. 109122322
Jul. 24, 2020 (TW) .................................. 109125369

(51) Int. Cl.
*A47B 88/57* (2017.01)
*A47B 88/493* (2017.01)
*A47B 88/437* (2017.01)

(52) U.S. Cl.
CPC .......... *A47B 88/493* (2017.01); *A47B 88/437* (2017.01); *A47B 88/57* (2017.01); *A47B 2210/0018* (2013.01); *A47B 2210/0091* (2013.01); *A47B 2220/0022* (2013.01)

(58) Field of Classification Search
CPC ..... A47B 88/57; A47B 88/437; A47B 88/493; A47B 2210/0018; A47B 2210/0091; A47B 2220/0022
See application file for complete search history.

(56) References Cited

U.S. PATENT DOCUMENTS

| 4,469,384 A | * | 9/1984 | Fler | A47B 88/493 312/333 |
| 6,244,678 B1 | * | 6/2001 | Dopp | A47B 88/493 312/334.44 |
| 11,160,371 B2 | * | 11/2021 | Chen | A47B 88/493 |
| 2004/0056572 A1 | * | 3/2004 | Chen | A47B 88/473 312/333 |

* cited by examiner

*Primary Examiner* — James O Hansen
(74) *Attorney, Agent, or Firm* — Rosenberg, Klein & Lee

(57) ABSTRACT

A slide rail assembly includes a first rail, a second rail, a third rail, and a position-limiting member. The third rail is movably mounted between the first and the second rails. The second and the third rails can be displaced with respect to the first rail from a predetermined position in a first direction. When the second and the third rails are at the predetermined position with respect to the first rail, a first portion of the position-limiting member is adjacent to an end portion of the three rails, and a second portion of the position-limiting member prevents the three rails from separating from one another in a second direction substantially perpendicular to the first direction.

9 Claims, 13 Drawing Sheets

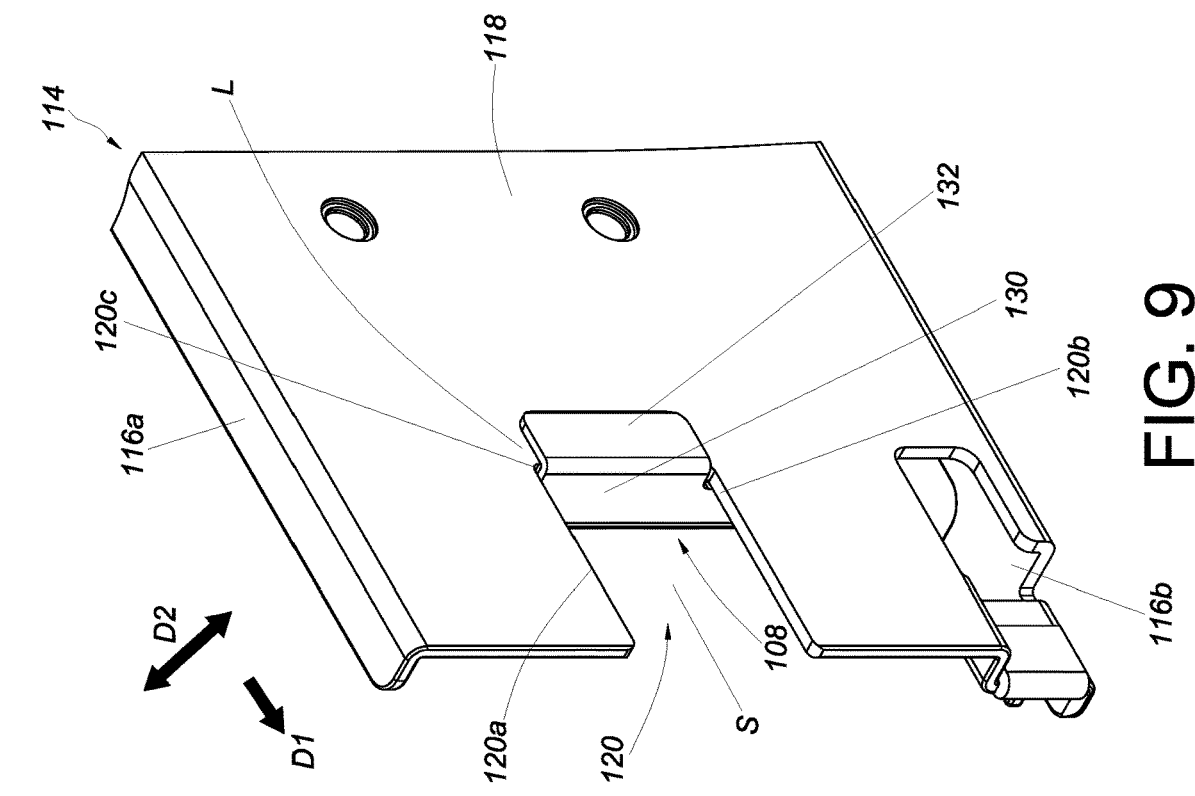
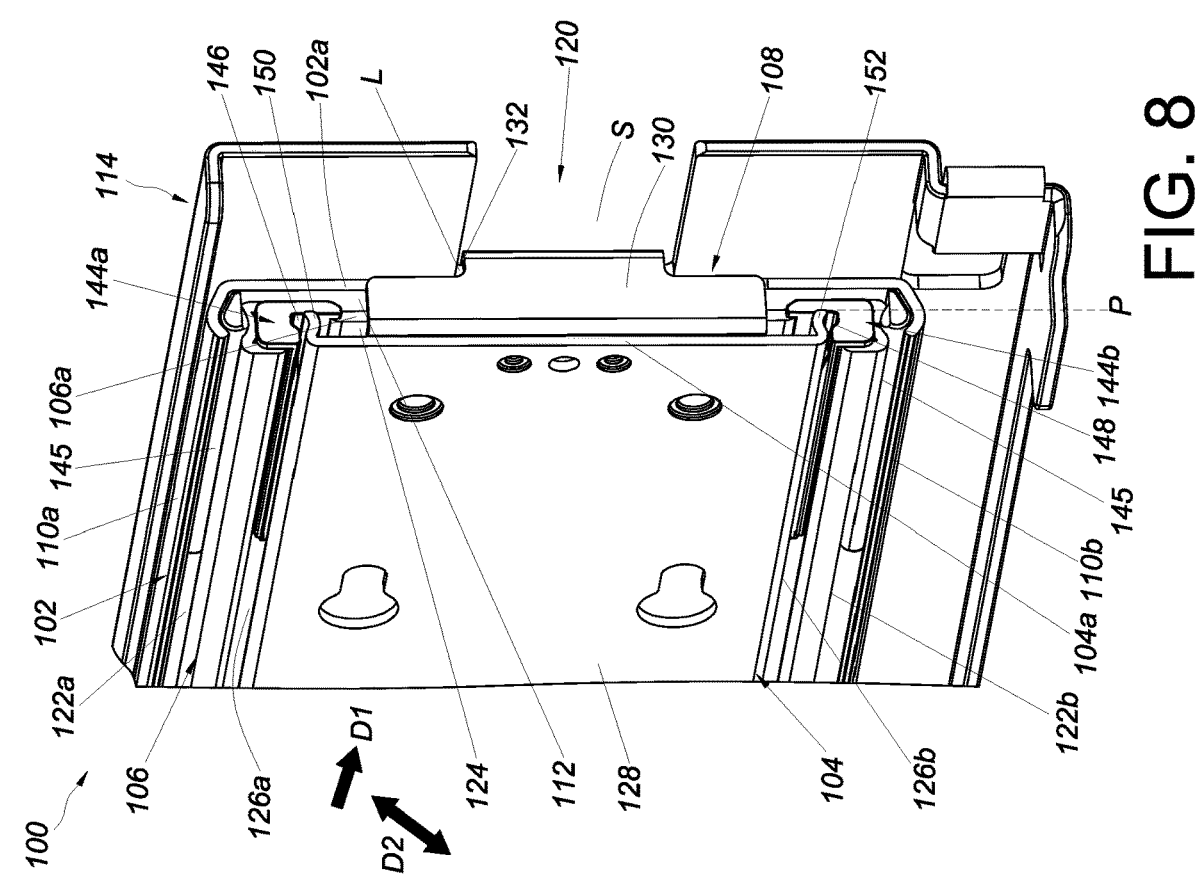
FIG. 8
FIG. 9

SLIDE RAIL ASSEMBLY

CROSS REFERENCE TO RELATED APPLICATIONS

This application is a continuation of U.S. patent application Ser. No. 17/034,574 filed Sep. 28, 2020.

FIELD OF THE INVENTION

The present invention relates to a slide rail and more particularly to a slide rail assembly that is reliable.

BACKGROUND OF THE INVENTION

FIG. 1 shows a conventional slide rail assembly 10. The slide rail assembly 10 includes a plurality of slide rails, in which the second rail 14 is movably mounted in the channel 16 of the first rail 12. A slide-facilitating device 18 has a plurality of rolling balls to help the second rail 14 displace longitudinally with respect to the first rail 12. The slide rail assembly 10 must comply with certain safety regulations and pass quality control checks in order to meet basic market requirements. For example, it is generally required to subject the slide rail assembly 10 to a vibration test in order to know whether the slide rails of the slide rail assembly 10 are durable and can carry an object of a specific weight (e.g., a server, drawer, or the like). If the slide rails separate from one another or are bent while the slide rail assembly 10 is taking the vibration test (e.g., when the slide rail assembly 10 is subjected to the force F in FIG. 1), the safety and quality of the slide rail assembly 10 will raise concerns. FIG. 1 shows that a portion of the second rail 14 is separated from or bent with respect to the first rail 12 in the transverse (or lateral) direction when the slide rail assembly 10 is subjected to the force F. The second rail 14, therefore, is no longer properly mounted in the channel 16 of the first rail 12 and may have problem being displaced with respect to the first rail 12.

In light of the above, it is a worthwhile issue to develop a slide rail assembly that is reliable.

SUMMARY OF THE INVENTION

The present invention relates to a reliable slide rail assembly.

According to one aspect of the present invention, a slide rail assembly includes a first rail, a second rail, a third rail, and a position-limiting member. The first rail includes a first wall, a second wall, and a longitudinal wall connected between the first wall and the second wall of the first rail. The second rail includes a first wall, a second wall, and a longitudinal wall connected between the first wall and the second wall of the second rail. The third rail is movably mounted between the first rail and the second rail, and the second rail and the third rail can be displaced with respect to the first rail from a retracted position in a first direction. The position-limiting member includes a first portion and a second portion. When the second rail and the third rail are at the retracted position with respect to the first rail, the first portion of the position-limiting member is adjacent to a front end portion of the first rail, of the second rail, and of the third rail, and the second portion of the position-limiting member prevents the first rail, the second rail, and the third rail from separating from one another in a second direction that is substantially perpendicular to the first direction.

Preferably, the first rail is provided with a supporting frame. The supporting frame is fixedly connected to the first rail and includes a position-limiting feature. The position-limiting feature includes an upper portion, a lower portion, and an intermediate portion, wherein the upper portion, the lower portion, and the intermediate portion jointly define a position-limiting space. The second portion of the position-limiting member is configured to extend into the position-limiting space and thus enter a position-limiting relationship with the upper portion, the lower portion, and the intermediate portion of the position-limiting feature.

Preferably, the supporting frame includes an upper supporting portion, a lower supporting portion, and an intermediate supporting portion connected between the upper supporting portion and the lower supporting portion. The upper supporting portion is adjacent to the first wall of the first rail, the lower supporting portion is adjacent to the second wall of the first rail, and the intermediate supporting portion is adjacent to the longitudinal wall of the first rail.

Preferably, the position-limiting feature is in the form of a notch.

Preferably, the intermediate portion of the position-limiting feature is adjacent to the front end portion of the first rail, and the upper portion and the lower portion of the position-limiting feature extend beyond the front end portion of the first rail.

Preferably, the position-limiting member is fixedly provided on the second rail.

Preferably, the position-limiting member and the second rail are integrated.

Preferably, the second portion of the position-limiting member extends substantially perpendicularly from the first portion.

Preferably, when the second rail and the third rail reach an extended position after being displaced with respect to the first rail from the retracted position, the position-limiting member is located away from the front end portion of the first rail and the front end portion of the third rail.

Preferably, the slide rail assembly further includes at least one slide-facilitating device, and the first rail, the second rail, and the third rail support one another via the at least one slide-facilitating device.

According to another aspect of the present invention, a slide rail assembly includes a first rail, a second rail, a third rail, and a position-limiting member. The third rail is movably mounted between the first rail and the second rail. The first rail, the second rail, and the third rail can be longitudinally displaced with respect to one another. The position-limiting member is disposed on the second rail. When the second rail and the third rail are at a predetermined position with respect to the first rail, the position-limiting member is fastened to the first rail to prevent the first rail, the second rail, and the third rail from separating from one another in a transverse direction.

Preferably, the first rail includes a first wall, a second wall, and a longitudinal wall connected between the first wall and the second wall of the first rail; the first wall, the second wall, and the longitudinal wall of the first rail jointly define a channel; and the third rail is movably mounted in the channel of the first rail. Preferably, the third rail includes a first wall, a second wall, and a longitudinal wall connected between the first wall and the second wall of the third rail; the first wall, the second wall, and the longitudinal wall of the third rail jointly define a channel; and the second rail is movably mounted in the channel of the third rail.

Preferably, the predetermined position is a retracted position.

Preferably, the second rail includes a first end portion and a second end portion located away from the first end portion, and the position-limiting member is adjacent to the first end portion of the second rail.

Preferably, the position-limiting member includes a first portion and a second portion extending substantially perpendicularly from the first portion; the first rail is provided with a supporting frame; the supporting frame includes a position-limiting feature; the position-limiting feature includes an upper portion, a lower portion, and an intermediate portion; the upper portion, the lower portion, and the intermediate portion jointly define a position-limiting space; and when the second rail and the third rail are at the predetermined position with respect to the first rail, the second portion of the position-limiting member extends into the position-limiting space and thus enters a position-limiting relationship with the upper portion, the lower portion, and the intermediate portion of the position-limiting feature.

Preferably, the supporting frame includes an upper supporting portion, a lower supporting portion, and an intermediate supporting portion connected between the upper supporting portion and the lower supporting portion. The upper supporting portion is adjacent to the first wall of the first rail, the lower supporting portion is adjacent to the second wall of the first rail, and the intermediate supporting portion is adjacent to the longitudinal wall of the first rail.

Preferably, the slide rail assembly further includes a first supporting base disposed adjacent to the first wall of the third rail and a second supporting base disposed adjacent to the second wall of the third rail; the first supporting base includes a first groove; the second supporting base includes a second groove; the second rail includes a first wall, a second wall, and a longitudinal wall connected between the first wall and the second wall of the second rail; and the first wall of the second rail includes a first supporting leg extending into the first groove, and the second wall of the second rail includes a second supporting leg extending into the second groove, such that the second rail is kept from moving in the transverse direction.

Preferably, the slide rail assembly further includes at least one slide-facilitating device, and the first rail, the second rail, and the third rail support one another via the at least one slide-facilitating device. Preferably, the first rail includes a first end portion and a second end portion located away from the first end portion of the first rail, the slide rail assembly further includes two blocking portions disposed respectively adjacent to the first wall and the second wall of the first rail, and the two blocking portions are close to the first end portion of the first rail. Preferably, the third rail includes a first end portion and a second end portion located away from the first end portion of the third rail, and the first supporting base and the second supporting base are close to the first end portion of the third rail. While the second rail and the third rail are being extended with respect to the first rail, the at least one slide-facilitating device between the third rail and the first rail is blocked by the blocking portions when displaced to the first end portion of the first rail, and the at least one slide-facilitating device between the second rail and the third rail is blocked by the first supporting base and the second supporting base when displaced to the first end portion of the third rail.

According to yet another aspect of the present invention, a slide rail assembly includes a first rail, a second rail, a third rail, and a position-limiting member. The first rail includes a first wall, a second wall, and a longitudinal wall connected between the first wall and the second wall of the first rail. The second rail includes a first wall, a second wall, and a longitudinal wall connected between the first wall and the second wall of the second rail. The third rail is movably mounted between the first rail and the second rail and includes a first wall, a second wall, and a longitudinal wall connected between the first wall and the second wall of the third rail. The position-limiting member is disposed on the second rail. Two of the first rail, the second rail, and the third rail support each other via at least one slide-facilitating device. When the second rail and the third rail are at a predetermined positon with respect to the first rail, a predetermined distance exists between one end of the at least one slide-facilitating device and a first end portion of the first rail, and a portion of the position-limiting member is adjacent to a lateral side of the longitudinal wall of the first rail.

BRIEF DESCRIPTION OF THE DRAWINGS

FIG. 8 is a partial perspective view of the slide rail assembly in the retracted state according to the first embodiment of the present invention;

FIG. 9 is another partial perspective view of the slide rail assembly in the retracted state according to the first embodiment of the present invention;

DETAILED DESCRIPTION OF THE INVENTION

Figure 1:
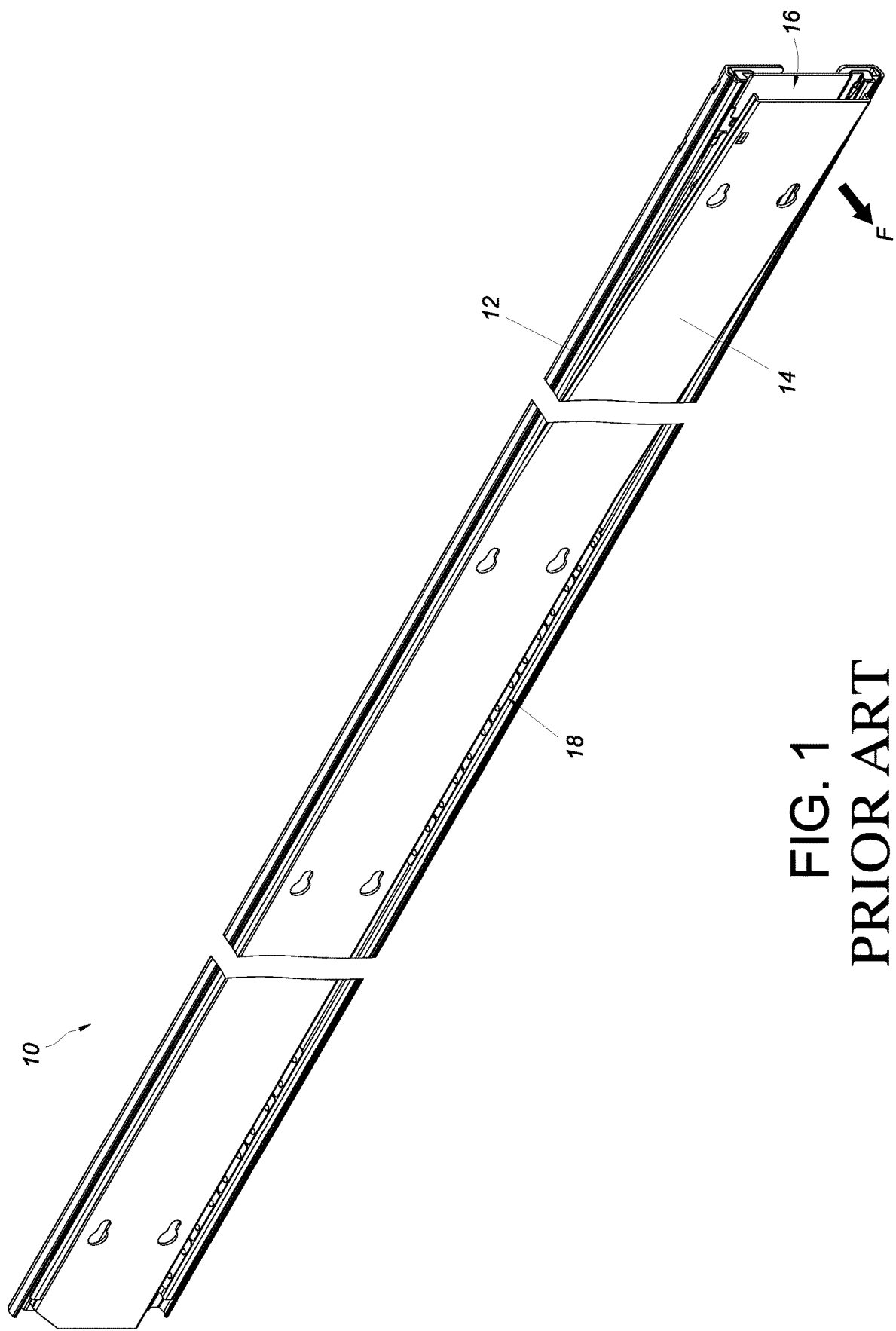
FIG. 1 is a perspective view of a conventional slide rail assembly.
Figure 2:
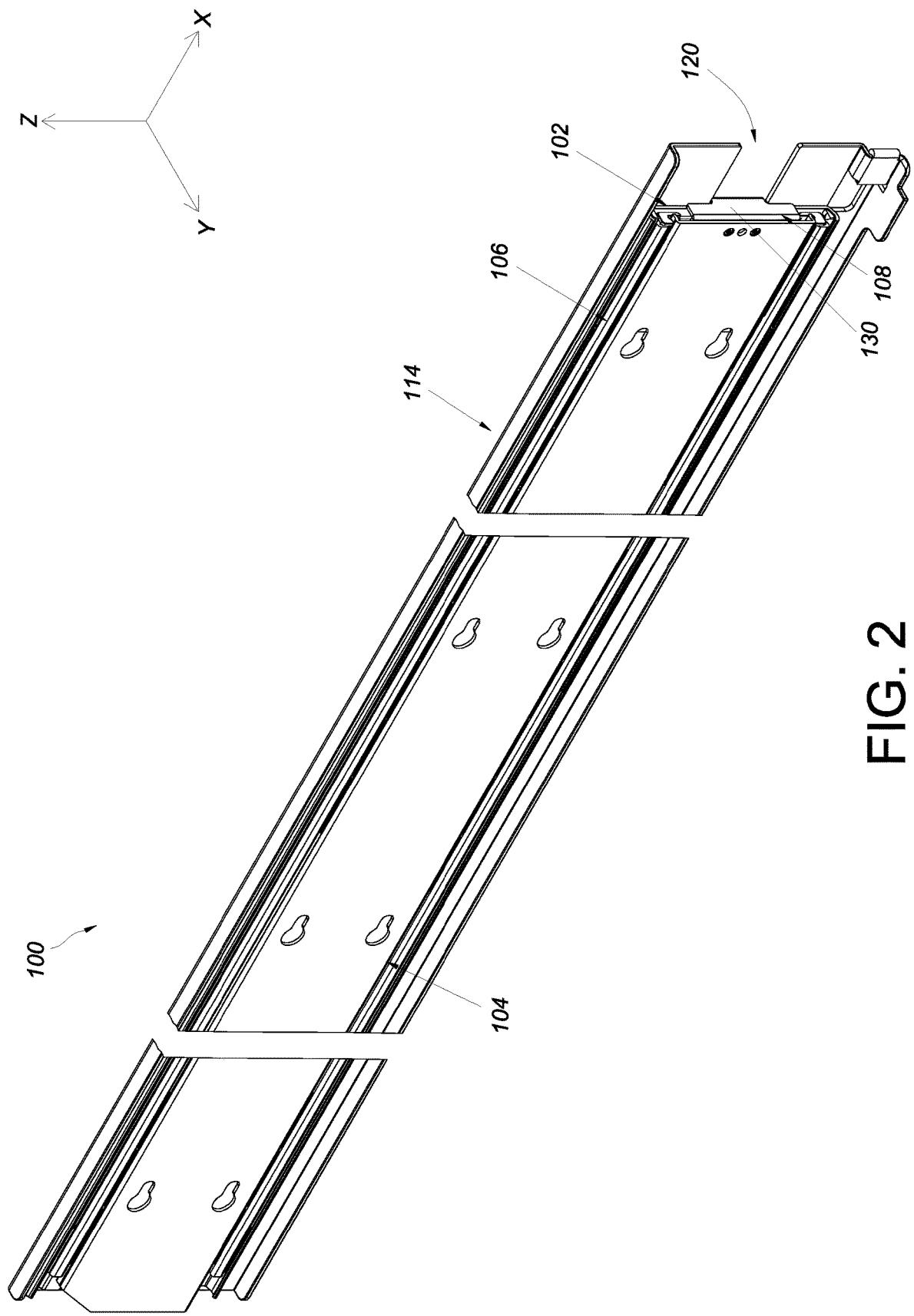
FIG. 2 is an assembled perspective view of the slide rail assembly according to the first embodiment of the present invention, showing that the slide rail assembly includes a first rail, a second rail, and a third rail.
Figure 3:
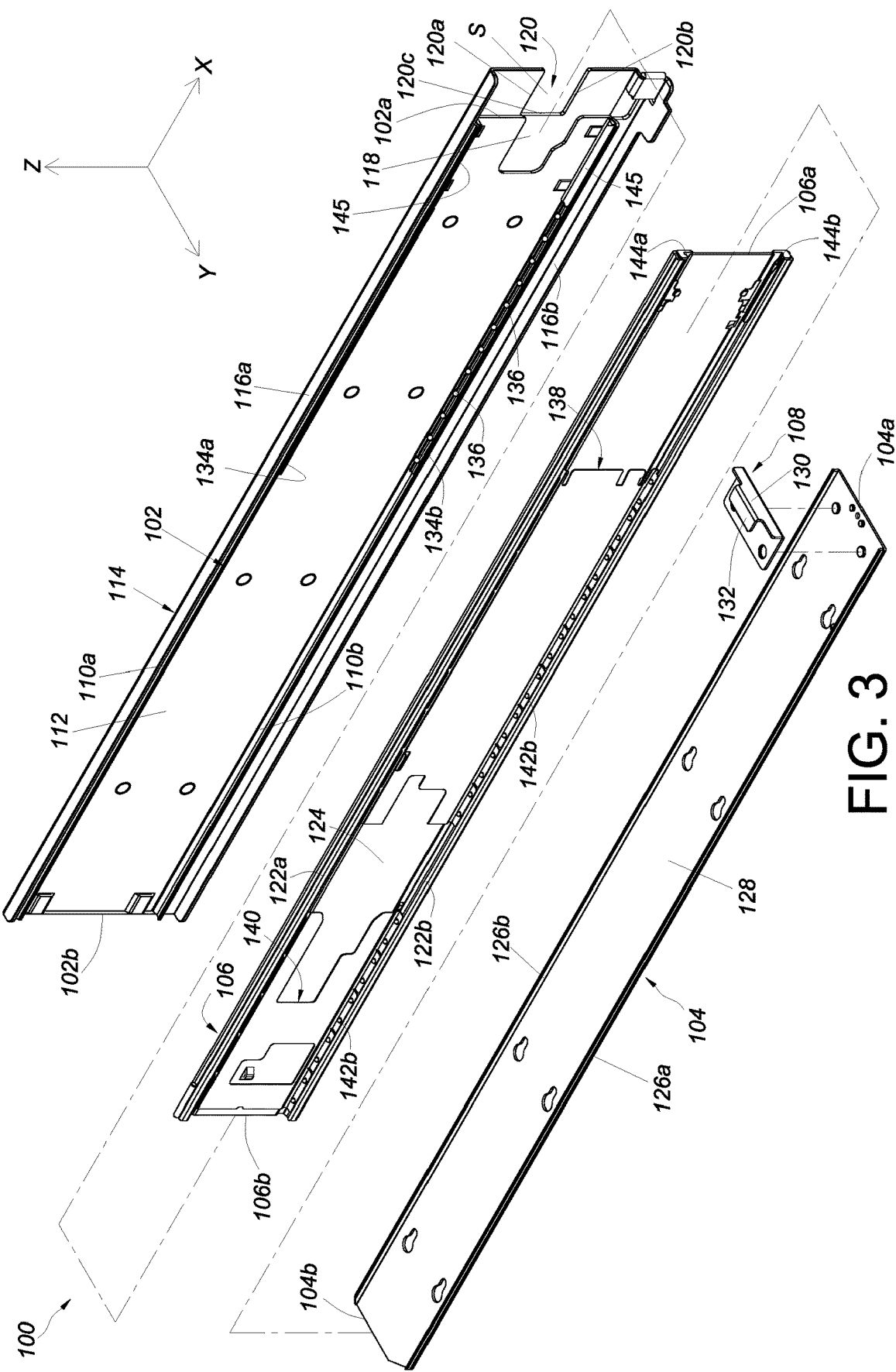
FIG. 3 is an exploded perspective view of the slide rail assembly according to the first embodiment of the present invention.

Referring to FIG. 2 and FIG. 3, the slide rail assembly 100 according to the first embodiment of the present invention includes a first rail 102, a second rail 104, a third rail 106, and a position-limiting member 108. The third rail 106 is movably mounted between the first rail 102 and the second rail 104. The first rail 102, the second rail 104, and the third rail 106 can be longitudinally displaced with respect to one another. The first rail 102, the third rail 106, and the second rail 104 are respectively an outer rail, an intermediate rail, and an inner rail by way of example but are not necessarily so in practice. It is worth mentioning that in this embodiment the X-axis direction is defined as the longitudinal direction (or the length direction or displacement direction of the slide rails), the Y-axis direction is defined as the transverse direction (or the lateral direction of the slide rails), and the Z-axis direction is defined as the vertical direction (or the height direction of the slide rails).

The first rail 102 includes a first wall 110a, a second wall 110b, and a longitudinal wall 112 connected between the first wall 110a and the second wall 110b of the first rail 102. The first wall 110a, the second wall 110b, and the longitudinal wall 112 of the first rail 102 jointly define a channel. The first rail 102 is provided with a supporting frame 114. The supporting frame 114 is connected (e.g., fixedly connected) to the first rail 102 and can therefore be viewed as a portion of the first rail 102; in other words, the supporting frame 114 and the first rail 102 can be regarded as a single unit. The first rail 102 includes a first end portion 102a and a second end portion 102b located away from the first end portion 102a. The first end portion 102a and the second end portion 102b are respectively a front end portion and a rear end portion by way of example but are not necessarily so in practice. The supporting frame 114 includes an upper supporting portion 116a, a lower supporting portion 116b, and an intermediate supporting portion 118 connected between the upper supporting portion 116a and the lower supporting portion 116b. The upper supporting portion 116a is adjacent to the first wall 110a of the first rail 102, the lower supporting portion 116b is adjacent to the second wall 110b of the first rail 102, and the intermediate supporting portion 118 is adjacent to the longitudinal wall 112 of the first rail 102.

Preferably, the supporting frame 114 includes a position-limiting feature 120. The position-limiting feature 120 includes an upper portion 120a, a lower portion 120b, and an intermediate portion 120c. The upper portion 120a, the lower portion 120b, and the intermediate portion 120c jointly define a position-limiting space S.

Preferably, the position-limiting feature 120 is in the form of a notch.

Preferably, the intermediate portion 120c of the position-limiting feature 120 is adjacent to the first end portion 102a (e.g., the front end portion) of the first rail 102, and the upper portion 120a and the lower portion 120b of the position-limiting feature 120 extend beyond the first end portion 102a (e.g., the front end portion) of the first rail 102.

The third rail 106 is movably mounted in the channel of the first rail 102. The third rail 106 includes a first wall 122a, a second wall 122b, and a longitudinal wall 124 connected between the first wall 122a and the second wall 122b of the third rail 106. The first wall 122a, the second wall 122b, and the longitudinal wall 124 of the third rail 106 jointly define a channel. The third rail 106 includes a first end portion 106a and a second end portion 106b located away from the first end portion 106a. The first end portion 106a and the second end portion 106b are respectively a front end portion and a rear end portion by way of example but are not necessarily so in practice.

The second rail 104 is movably mounted in the channel of the third rail 106. The second rail 104 includes a first wall 126a, a second wall 126b, and a longitudinal wall 128 connected between the first wall 126a and the second wall 126b of the second rail 104. The second rail 104 includes a first end portion 104a and a second end portion 104b located away from the first end portion 104a. The first end portion 104a and the second end portion 104b are respectively a front end portion and a rear end portion by way of example but are not necessarily so in practice.

Preferably, the slide rail assembly 100 further includes at least one slide-facilitating device, and the first rail 102, the second rail 104, and the third rail 106 support one another via the at least one slide-facilitating device. For example, the slide rail assembly 100 includes at least one slide-facilitating device for helping the first rail 102 and the third rail 106 to displace smoothly with respect to each other. Here, by way of example, the at least one slide-facilitating device includes a first ball bearing strip 134a and a second ball bearing strip 134b, both located in the channel of the first rail 102, and each having a plurality of rolling members 136 for supporting the first wall 122a or the second wall 122b of the third rail 106. The slide rail assembly 100 further includes at least another slide-facilitating device for helping the second rail 104 and the third rail 106 to displace smoothly with respect to each other. Here, by way of example, the at least another slide-facilitating device includes a first slide-facilitating device 138 and a second slide-facilitating device 140, both movably mounted in the channel of the third rail 106. The first slide-facilitating device 138 and the second slide-facilitating device 140 are configured to support different rail sections of the second rail 104 respectively and each include a plurality of first rolling balls 142a and a plurality of second rolling balls 142b (see FIG. 6). The first rolling balls 142a of the first slide-facilitating device 138 and of the second slide-facilitating device 140 are supported between the first wall 122a of the third rail 106 and the first wall 126a of the second rail 104, and the second rolling balls 142b of the first slide-facilitating device 138 and of the second slide-facilitating device 140 are supported between the second wall 122b of the third rail 106 and the second wall 126b of the second rail 104.

Figure 4:
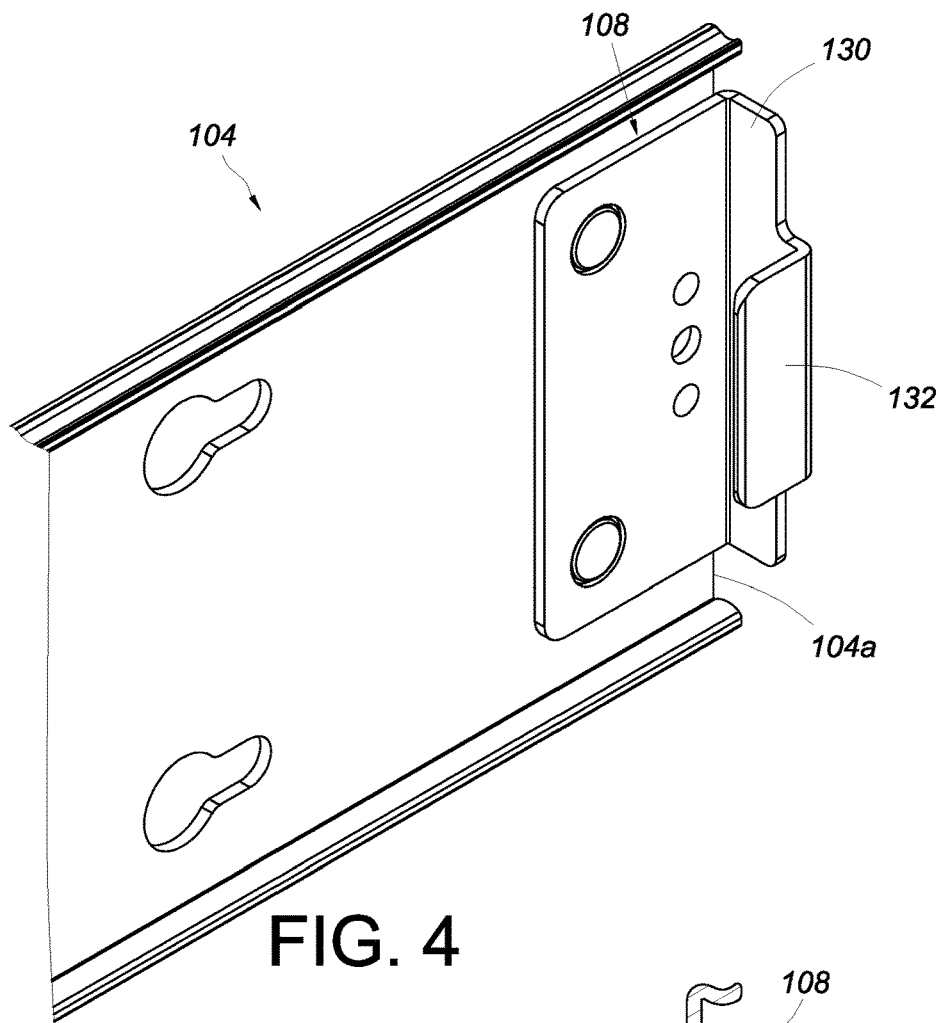
FIG. 4 is a partial perspective view of the second rail of the slide rail assembly according to the first embodiment of the present invention.
Figure 5:
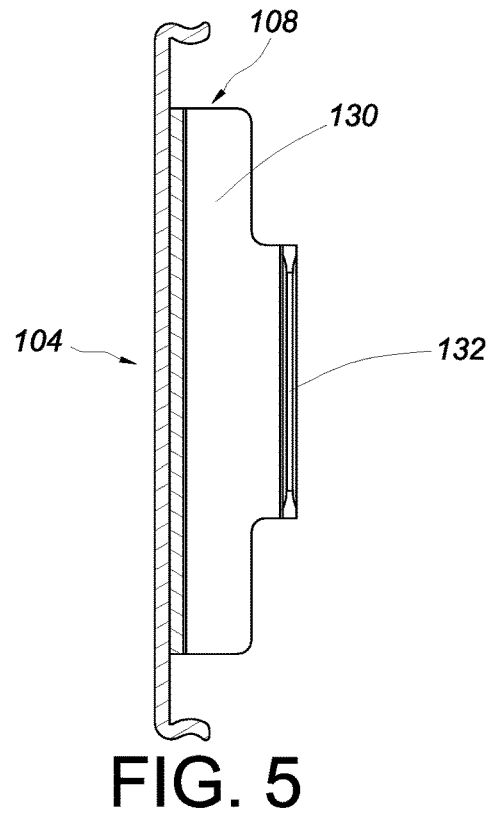
FIG. 5 is a sectional view of the second rail of the slide rail assembly according to the first embodiment of the present invention.

Referring to FIG. 3, FIG. 4, and FIG. 5, the position-limiting member 108 is disposed on the second rail 104, and the position-limiting member 108 includes a first portion 130 and a second portion 132. Preferably, the position-limiting member 108 is fixedly provided on the second rail 104, and the second portion 132 of the position-limiting member 108 extends substantially perpendicularly from the first portion 130. The position-limiting member 108 is preferably adjacent to the first end portion 104a of the second rail 104 but is not necessarily so in practice.

Figure 6:
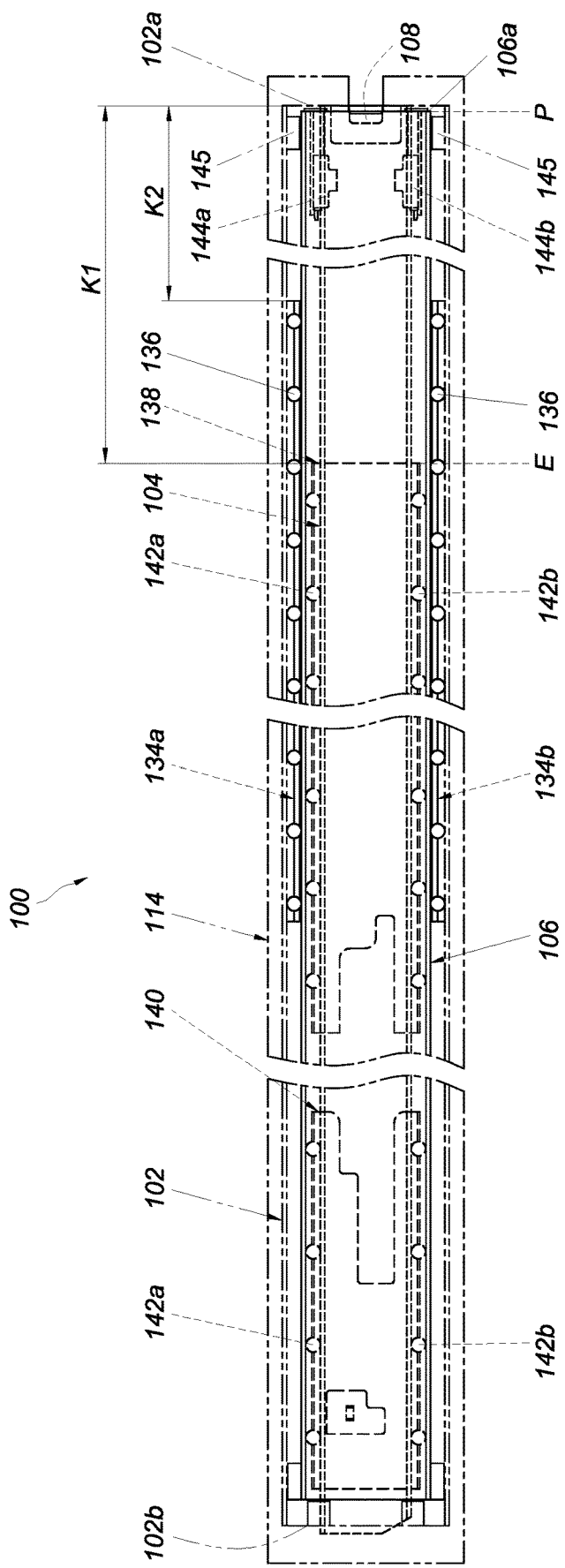
FIG. 6 shows the slide rail assembly in a retracted state according to the first embodiment of the present invention.
Figure 7:
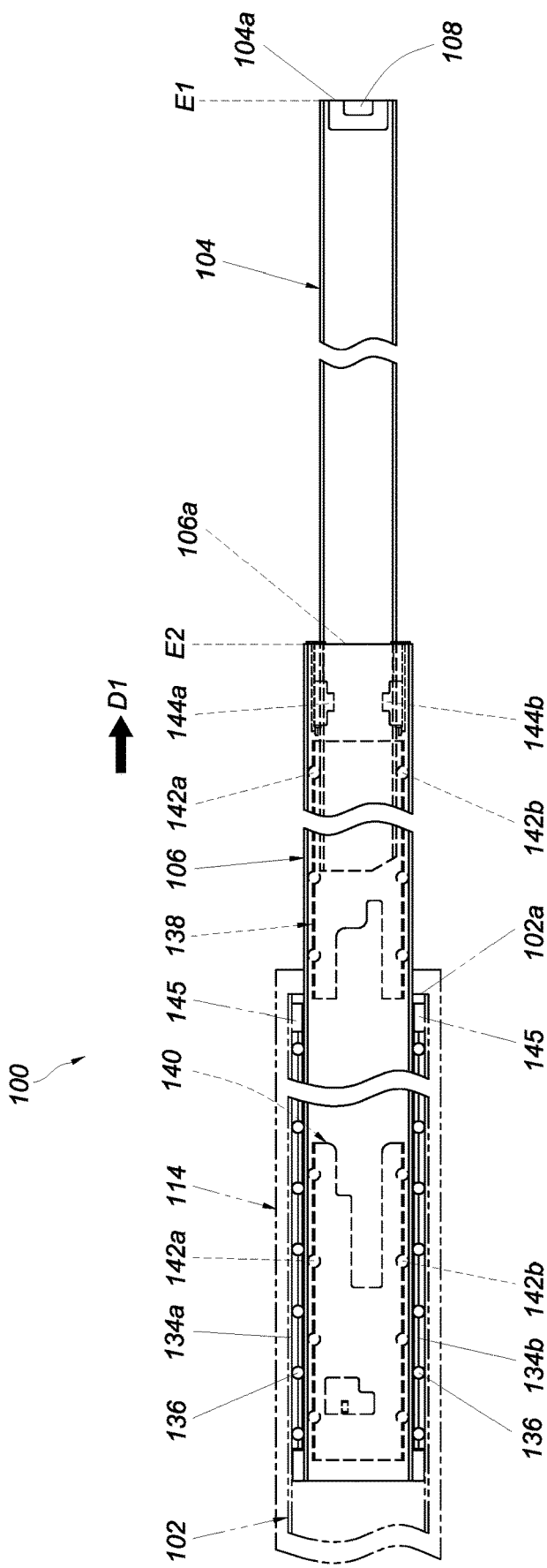
FIG. 7 shows the slide rail assembly in an extended state according to the first embodiment of the present invention.

Referring to FIG. 6 and FIG. 7, the second rail 104 and the third rail 106 can be displaced to a predetermined position P (e.g., a retracted position as shown in FIG. 6) with respect to the first rail 102 such that not only do the first rail 102 and the third rail 106 support each other via the at least one slide-facilitating device (e.g., the first ball bearing strip 134a and the second ball bearing strip 134b), but also the third rail 106 and the second rail 104 support each other via the at least another slide-facilitating device (e.g., the first slide-facilitating device 138 and the second slide-facilitating device 140). When the second rail 104 and the third rail 106 are at the predetermined position P with respect to the first rail 102, a first predetermined distance K1 exists between a first end (e.g., the front end) of the at least another slide-facilitating device (e.g., the first slide-facilitating device 138) and the first end portion 106a of the third rail 106, and a second predetermined distance K2 exists between a first end (e.g., the front end) of the at least one slide-facilitating device (e.g., the first ball bearing strip 134a and the second ball bearing strip 134b) and the first end portion 102a of the first rail 102.

When the second rail 104 and the third rail 106 respectively reach a first extended position E1 and a second extended position E2 after being displaced with respect to the first rail 102 from the predetermined position P in a first direction D1 (e.g., in the longitudinal direction), as shown in FIG. 7, the position-limiting member 108 is located away from the front end portion 102a of the first rail 102 and the front end portion 106a of the third rail 106, and the at least another slide-facilitating device (e.g., the first slide-facilitating device 138) and the at least one slide-facilitating device (e.g., the first ball bearing strip 134a and the second ball bearing strip 134b) are also displaced in the first direction D1 and become closer to the first end portion 106a of the third rail 106 and the first end portion 102a of the first rail 102 respectively.

Preferably, the slide rail assembly 100 further includes at least one supporting base, such as a first supporting base 144a disposed adjacent to the first wall 122a of the third rail 106 and a second supporting base 144b disposed adjacent to the second wall 122b of the third rail 106. Here, by way of example, the first supporting base 144a and the second supporting base 144b are close to the first end portion 106a of the third rail 106 and are located at an end opening of the channel of the third rail 106. The slide rail assembly further includes two blocking portions 145 (e.g., two front blocking portions) disposed respectively adjacent to the first wall 110a and the second wall 110b of the first rail 102. Here, by way of example, the two blocking portions 145 are close to the first end portion 102a of the first rail 102 and are located at an end opening of the channel of the first rail 102. When the second rail 104 and the third rail 106 respectively reach the first extended position E1 and the second extended position E2 after being displaced with respect to the first rail 102 in the first direction D1 (see FIG. 7), the at least another slide-facilitating device (e.g., the first slide-facilitating device 138) is blocked by the first supporting base 144a and the second supporting base 144b of the third rail 106, and the at least one slide-facilitating device (e.g., the first ball bearing strip 134a and the second ball bearing strip 134b) is blocked by the two blocking portions 145 of the first rail 102.

When the second rail 104 and the third rail 106 are at the predetermined position P with respect to the first rail 102, referring to FIG. 6, FIG. 8, and FIG. 9, the first portion 130 of the position-limiting member 108 is adjacent to the first end portions (e.g., the front end portions) 102a, 104a, and 106a of the first rail 102, the second rail 104, and the third rail 106, and the second portion 132 of the position-limiting member 108 prevents the first rail 102, the second rail 104, and the third rail 106 from separating from one another in a second direction D2 (e.g., the transverse or lateral direction), wherein the second direction D2 is substantially perpendicular to the first direction D1.

When the second rail 104 and the third rail 106 are at the predetermined position P with respect to the first rail 102, the second portion 132 of the position-limiting member 108 preferably extends into the position-limiting space S of the position-limiting feature 120 of the supporting frame 114 such that a position-limiting relationship is established between the second portion 132 of the position-limiting member 108 and the upper portion 120a, the lower portion 120b, and the intermediate portion 120c of the position-limiting feature 120 (see FIG. 8 and FIG. 9).

When the second rail 104 and the third rail 106 are at the predetermined position P with respect to the first rail 102, it is preferable that the first predetermined distance K1 exists between the first end (e.g., the front end) of the at least another slide-facilitating device (e.g., the first slide-facilitating device 138) and the first end portion 106a of the third rail 106 (see FIG. 6), and that the second predetermined distance K2 exists between the first end (e.g., the front end) of the at least one slide-facilitating device (e.g., the first ball bearing strip 134a and the second ball bearing strip 134b) and the first end portion 102a of the first rail 102 (see FIG. 6); that is to say, the rail section of the second rail 104 that lies in the extent of the first predetermined distance K1 will be left unsupported by the at least another slide-facilitating device (e.g., the first slide-facilitating device 138 and the second slide-facilitating device 140), and the rail section of the third rail 106 that lies in the extent of the second predetermined distance K2 will be left unsupported by the at least one slide-facilitating device (e.g., the first ball bearing strip 134a and the second ball bearing strip 134b). If a force (e.g., external force) is applied to the slide rail assembly 100 in this state, the rail sections of the first, the second, and the third rails 102, 104, and 106 that lie in the extents of the predetermined distances K1 and K2 may separate from one another under the action of the force (e.g., external force) due to the fact that those rail sections are not effectively supported. In this embodiment, therefore, a portion (e.g., the second portion 132) of the position-limiting member 108 is configured to be adjacent to a lateral side L of the longitudinal wall 112 of the first rail 102 (or a lateral side L of the intermediate supporting portion 118 of the supporting frame 114 of the first rail 102), e.g., to be fastened to the lateral side L of the longitudinal wall 112 of the first rail 102 (or the lateral side L of the intermediate supporting portion 118 of the supporting frame 114 of the first rail 102) as shown in FIG. 8 and FIG. 9, in order to prevent the first rail 102, the second rail 104, and the third rail 106 from moving with respect to or separating from one another in the second direction D2 (e.g., the transverse or lateral direction). In other words, the aforesaid portion (e.g., the second portion 132) of the position-limiting member 108 will be adjacent to the lateral side L of the longitudinal wall 112 of the first rail 102 (or the lateral side L of the intermediate supporting portion 118 of the supporting frame 114 of the first rail 102) when the second rail 104 and the third rail 106 are at the predetermined position P with respect to the first rail 102, and the aforesaid portion (e.g., the second portion 132) of the position-limiting member 108 and the lateral side L of the longitudinal wall 112 of the first rail 102 (or the lateral side L of the intermediate supporting portion 118 of the supporting frame 114 of the first rail 102) will be able to contact each other and thereby produce a blocking effect when the force is applied to the slide rail assembly 100 in the second direction D2 (see FIG. 8 and FIG. 9), lest the first rail 102, the second rail 104, and the third rail 106 move with respect to or separate from one another in the second direction D2 (e.g., the transverse or lateral direction). The first portion 130 and the second portion 132 of the position-limiting member 108 jointly define a space for receiving at least a portion of the first end portion 102a of the first rail 102 (or of the intermediate portion 120c of the supporting frame 114) and at least a portion of the first end portion 106a of the third rail 106 (see FIG. 8 and FIG. 9).

Preferably, the first supporting base 144a includes a first groove 146, and the second supporting base 144b includes a second groove 148 (see FIG. 8). It is also preferable that the first wall 126a of the second rail 104 includes a first supporting leg 150 extending into the first groove 146, and that the second wall 126b of the second rail 104 includes a second supporting leg 152 extending into the second groove 148. When at the predetermined position P with respect to the first rail 102, the second rail 104 and the third rail 106 are kept from moving with respect to or separating from each other in the second direction D2 thanks to the first supporting leg 150 of the second rail 104 extending into the first groove 146 and the second supporting leg 152 of the second rail 104 extending into the second groove 148 (see FIG. 8).

As stated above, the portions of the first wall 126a and of the second wall 126b of the second rail 104 that lie in the extent of the first predetermined distance K1 can be supported respectively by the first supporting base 144a and the second supporting base 144b when the force is applied to the slide rail assembly 100 in the second direction D2 (see FIG. 8 and FIG. 9). If, however, the force is large enough to separate the first supporting leg 150 of the first wall 126a of the second rail 104 and the second supporting leg 152 of the second wall 126b of the second rail 104 from the first groove 146 of the first supporting base 144a and the second groove 148 of the second supporting base 144b respectively in the second direction D2, those portions of the first wall 126a and of the second wall 126b of the second rail 104 that lie in the extent of the first predetermined distance K1 may still be rendered improperly located in the channel of the third rail 106. In this embodiment, therefore, the aforesaid portion (e.g., the second portion 132) of the position-limiting member 108 is configured to be adjacent to the lateral side L of the longitudinal wall 112 of the first rail 102 (or the lateral side L of the intermediate supporting portion 118 of the supporting frame 114 of the first rail 102) to prevent the second rail 104 and the third rail 106 from moving with respect to each other in the second direction D2 (see FIG. 8). That is to say, the position-limiting member 108 ensures that the first supporting leg 150 of the first wall 126a of the second rail 104 and the second supporting leg 152 of the second wall 126b of the second rail 104 will not separate from the first groove 146 of the first supporting base 144a and the second groove 148 of the second supporting base 144b respectively. It is thus ensured that the second rail 104, when mounted in the channel of the third rail 106, will stay securely mounted in the channel of the third rail 106 without being affected by the force (e.g., external force), and that the slide rail assembly 100 is therefore reliable and safe in terms of use.

Figure 10:
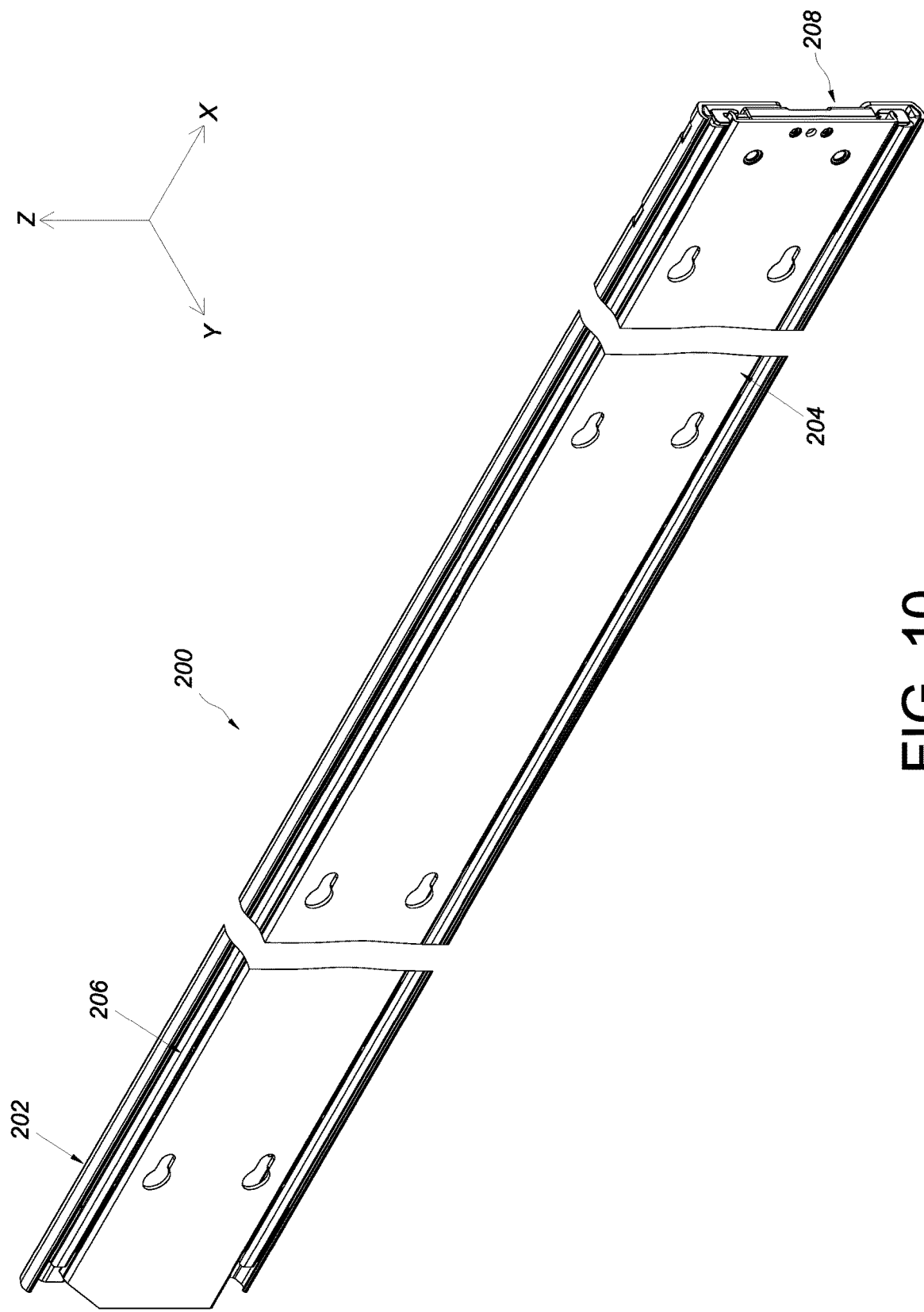
FIG. 10 is an assembled perspective view of the slide rail assembly according to the second embodiment of the present invention, showing that the slide rail assembly includes a first rail, a second rail, and a third rail.
Figure 11:
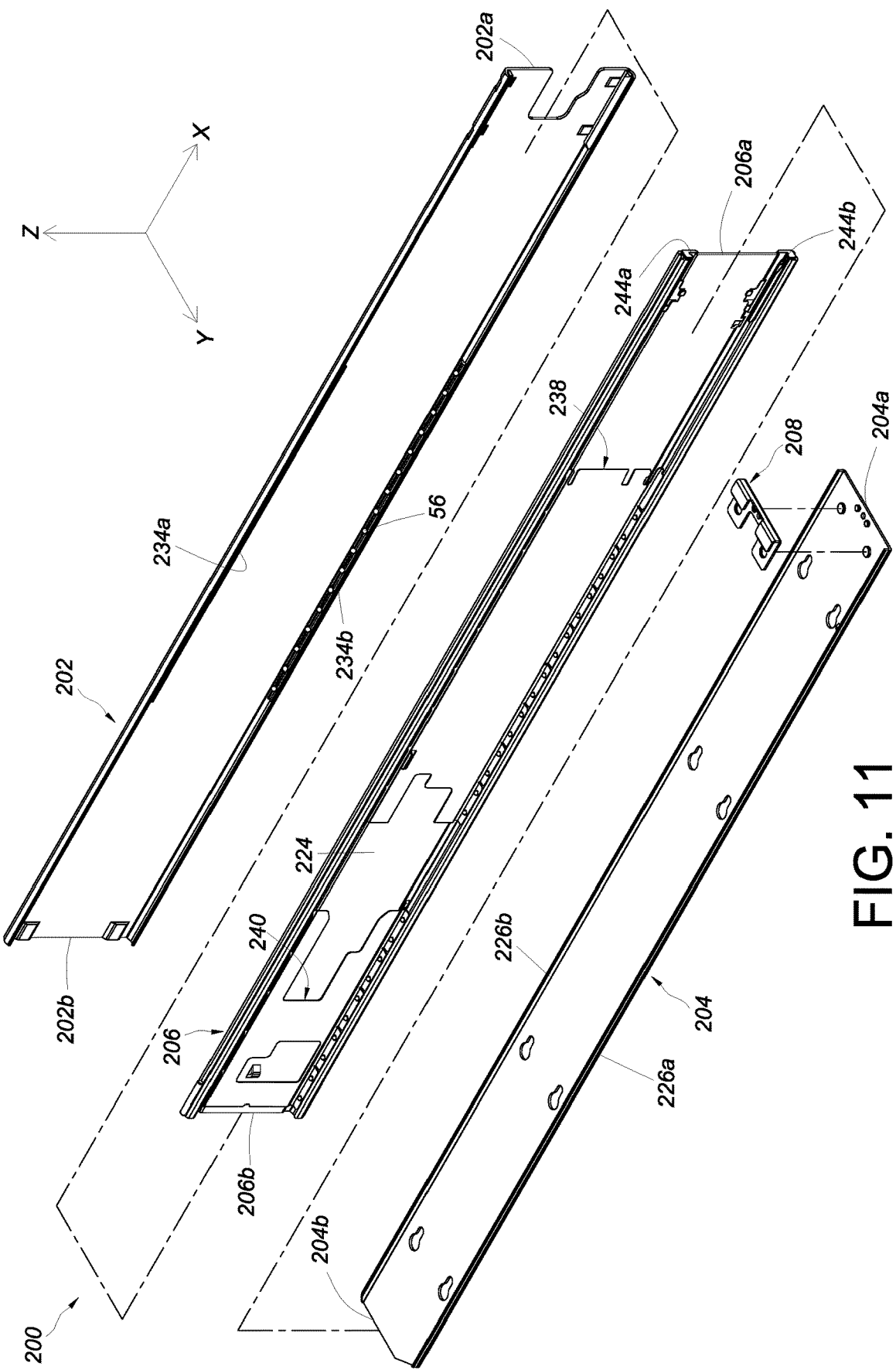
FIG. 11 is an exploded perspective view of the slide rail assembly according to the second embodiment of the present invention.

Referring to FIG. 10 and FIG. 11, the slide rail assembly 200 according to the second embodiment of the present invention includes a first rail 202, a second rail 204, a third rail 206, and a position-limiting member 208. The third rail 206 is movably mounted between the first rail 202 and the second rail 204.

Figure 12:
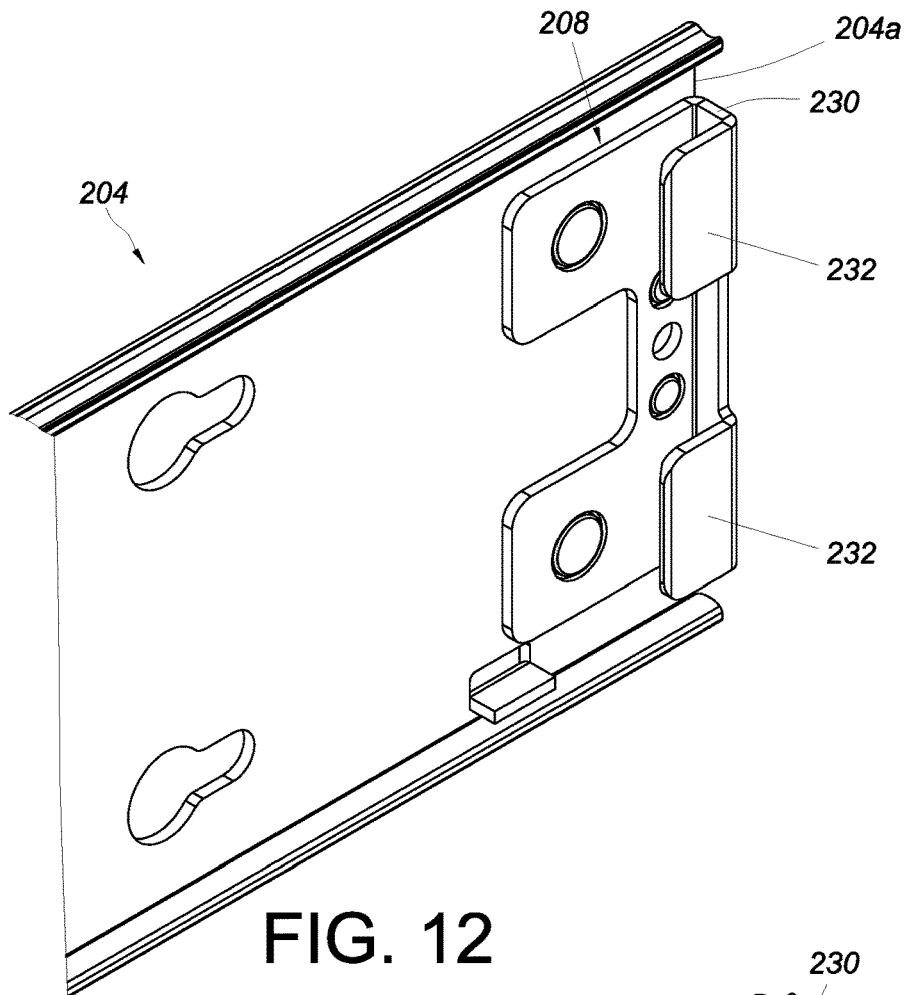
FIG. 12 is a partial perspective view of the second rail of the slide rail assembly according to the second embodiment of the present invention.
Figure 13:
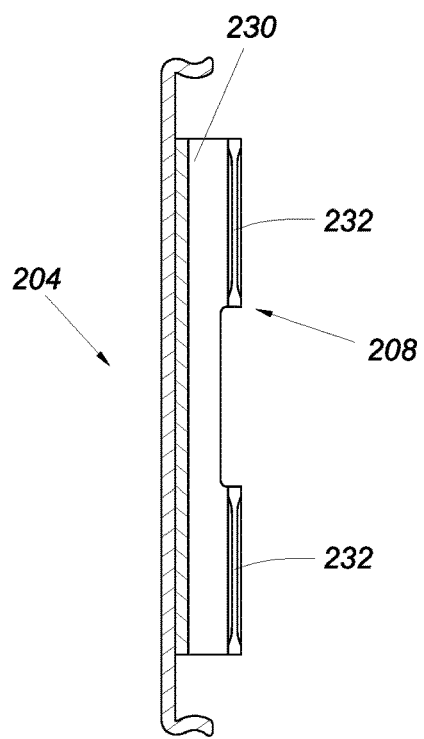
FIG. 13 is a sectional view of the second rail of the slide rail assembly according to the second embodiment of the present invention.

Referring to FIG. 11, FIG. 12, and FIG. 13, the position-limiting member 208 is disposed on the second rail 204, and the position-limiting member 208 includes a first portion 230 and a second portion 232. Preferably, the position-limiting member 208 is fixedly provided on the second rail 204, and the second portion 232 of the position-limiting member 208 extends substantially perpendicularly from the first portion 230. The position-limiting member 208 is preferably adjacent to the first end portion 204a of the second rail 204 but is not necessarily so in practice.

Figure 14:
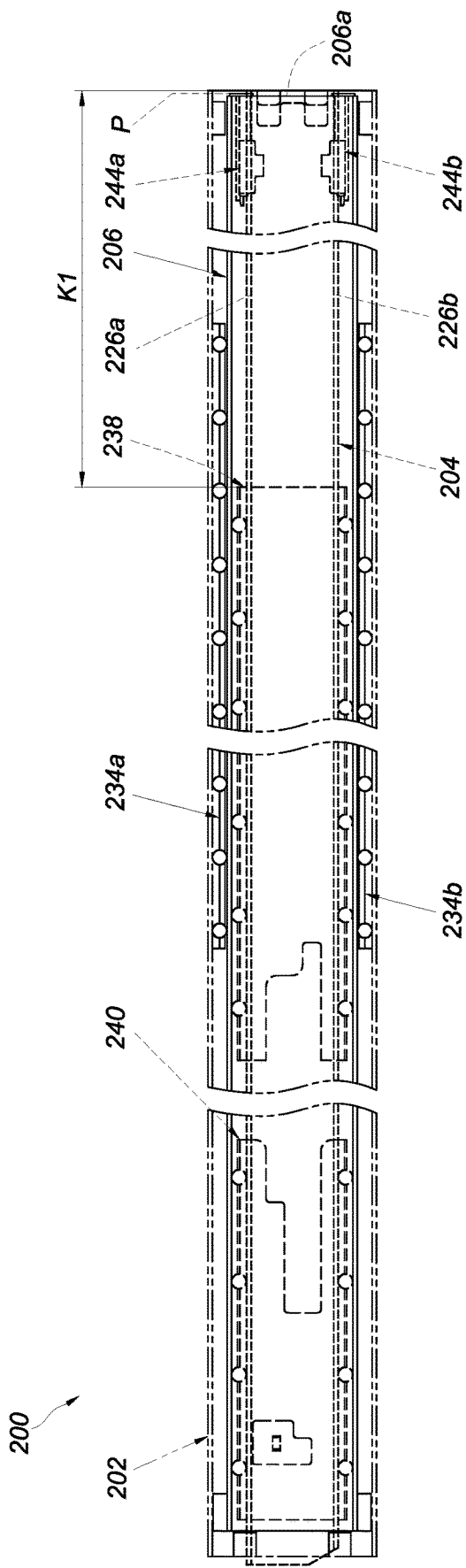
FIG. 14 shows the slide rail assembly in a retracted state according to the second embodiment of the present invention.

Referring to FIG. 14, the second rail 204 and the third rail 206 can be displaced to the predetermined position P (e.g., a retracted position) with respect to the first rail 202 such that not only do the first rail 202 and the third rail 206 support each other via the at least one slide-facilitating device (e.g., the first ball bearing strip 234a and the second ball bearing strip 234b), but also the third rail 206 and the second rail 204 support each other via the at least another slide-facilitating device (e.g., the first slide-facilitating device 238 and the second slide-facilitating device 240). When the second rail 204 and the third rail 206 are at the predetermined position P with respect to the first rail 202, a first predetermined distance K1 exists between the first end (e.g., the front end) of the at least another slide-facilitating device (e.g., the first slide-facilitating device 238) and the first end portion 206a of the third rail 206.

Figure 16:
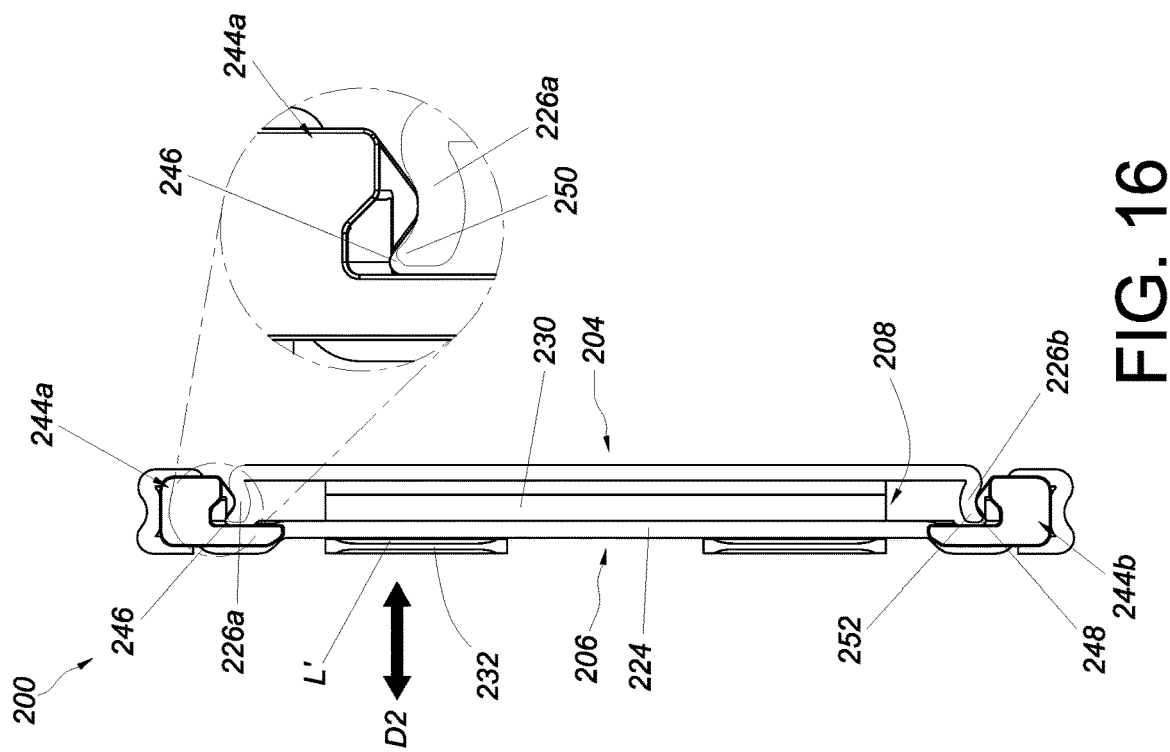
FIG. 16 is a sectional view of the slide rail assembly according to the second embodiment of the present invention, with the second rail at the predetermined position with respect to the third rail.
Figure 15:
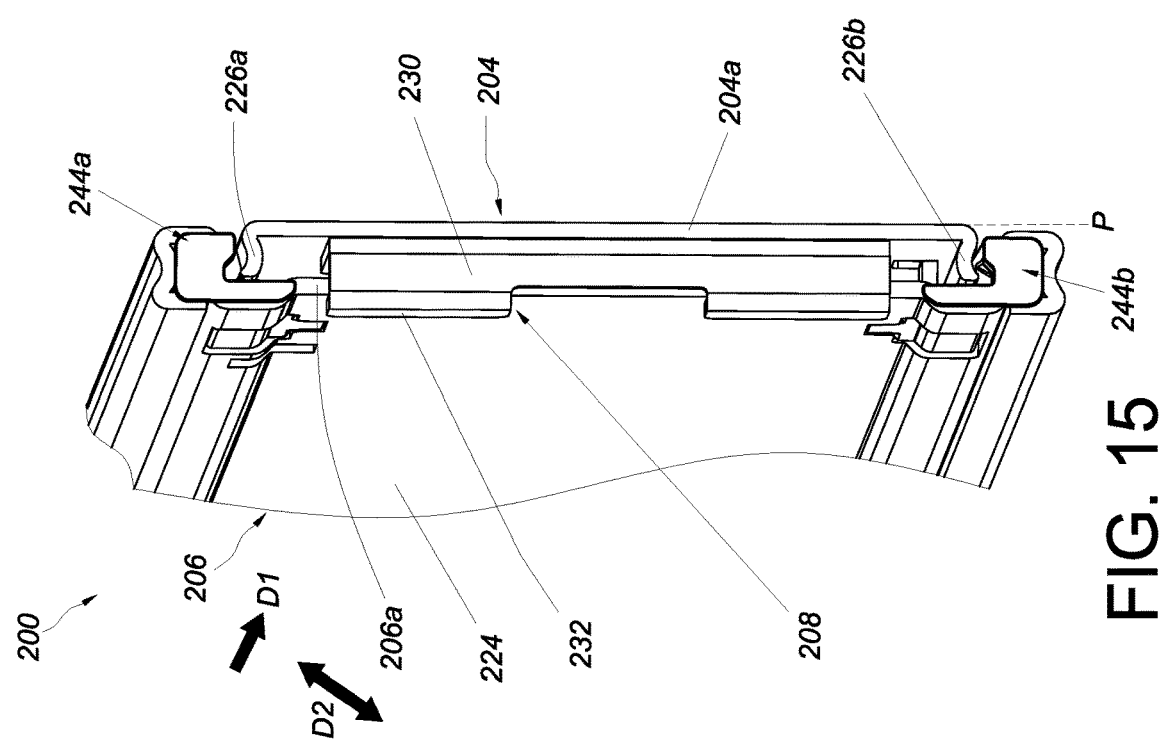
FIG. 15 is a partial perspective view of the slide rail assembly according to the second embodiment of the present invention, with the second rail at a predetermined position with respect to the third rail.

Referring to FIG. 14, FIG. 15, and FIG. 16, when the second rail 204 is at the predetermined position P with respect to the third rail 206, the first portion 230 of the position-limiting member 208 is adjacent to the first end portion (e.g., the front end portion) 204a of the second rail 204 and the first end portion (e.g., the front end portion) 206a of the third rail 206, and the second portion 232 of the position-limiting member 208 prevents the second rail 204 and the third rail 206 from separating from each other in the second direction D2 (e.g., the transverse or lateral direction), wherein the second direction D2 is substantially perpendicular to the first direction D1.

When the second rail 204 is at the predetermined position P with respect to the third rail 206, it is preferable that the first predetermined distance K1 exists between the first end (e.g., the front end) of the at least another slide-facilitating device (e.g., the first slide-facilitating device 238) and the first end portion 206a of the third rail 206 (see FIG. 14); that is to say, the rail section of the second rail 204 that lies in the extent of the first predetermined distance K1 will be left unsupported by the at least another slide-facilitating device (e.g., the first slide-facilitating device 238 and the second slide-facilitating device 240). If a force (e.g., external force) is applied to the slide rail assembly 200 in this state, the rail sections of the second and the third rails 204 and 206 that lie in the extent of the first predetermined distance K1 may separate from each other under the action of the force (e.g., external force) due to the fact that those rail sections are not effectively supported. In this embodiment, therefore, a portion (e.g., the second portion 232) of the position-limiting member 208 is configured to be adjacent to a lateral side L' of the longitudinal wall 224 of the third rail 206, e.g., to be fastened to the lateral side L' of the longitudinal wall 224 of the third rail 206, in order to prevent the second rail 204 and the third rail 206 from moving with respect to or separating from each other in the second direction D2 (e.g., the transverse or lateral direction). In other words, the aforesaid portion (e.g., the second portion 232) of the position-limiting member 208 will be adjacent to the lateral side L' of the longitudinal wall 224 of the third rail 206 when the second rail 204 is at the predetermined position P with respect to the third rail 206, and the aforesaid portion (e.g., the second portion 232) of the position-limiting member 208 and the lateral side L' of the longitudinal wall 224 of the third rail 206 will be able to contact each other and thereby produce a blocking effect when the force is applied to the slide rail assembly 200 in the second direction D2 (see FIG.

15 and FIG. 16), lest the second rail 204 and the third rail 206 move with respect to or separate from each other in the second direction D2 (e.g., the transverse or lateral direction). The first portion 230 and the second portion 232 of the position-limiting member 208 jointly define a space for receiving at least a portion of the first end portion 206a of the third rail 206.

Preferably, the slide rail assembly 200 further includes at least one supporting base, such as a first supporting base 244a and a second supporting base 244b, both disposed on the third rail 206. Here, the first supporting base 244a and the second supporting base 244b are close to the first end portion 206a of the third rail 206. It is preferable that the first supporting base 244a includes a first groove 246, that the second supporting base 244b includes a second groove 248, that the first wall 226a of the second rail 204 includes a first supporting leg 250 extending into the first groove 246, and that the second wall 226b of the second rail 204 includes a second supporting leg 252 extending into the second groove 248. When the second rail 204 is at the predetermined position P with respect to the third rail 206, the second rail 204 and the third rail 206 are kept from moving with respect to or separating from each other in the second direction D2 thanks to the first supporting leg 250 of the second rail 204 extending into the first groove 246 and the second supporting leg 252 of the second rail 204 extending into the second groove 248 (see FIG. 15 and FIG. 16).

As stated above, the portions of the first wall 226a and of the second wall 226b of the second rail 204 that lie in the extent of the first predetermined distance K1 can be supported respectively by the first supporting base 244a and the second supporting base 244b when the force is applied to the slide rail assembly 200 in the second direction D2 (see FIG. 14, FIG. 15, and FIG. 16). If, however, the force is large enough to separate the first supporting leg 250 of the first wall 226a of the second rail 204 and the second supporting leg 252 of the second wall 226b of the second rail 204 from the first groove 246 of the first supporting base 244a and the second groove 248 of the second supporting base 244b respectively in the second direction D2, those portions of the first wall 226a and of the second wall 226b of the second rail 204 that lie in the extent of the first predetermined distance K1 may still be rendered improperly located in the channel of the third rail 206. In this embodiment, therefore, the aforesaid portion (e.g., the second portion 232) of the position-limiting member 208 is configured to be adjacent to the lateral side L' of the longitudinal wall 224 of the third rail 206 to prevent the second rail 204 and the third rail 206 from moving with respect to each other in the second direction D2 (see FIG. 15 and FIG. 16). That is to say, the position-limiting member 208 ensures that the first supporting leg 250 of the first wall 226a of the second rail 204 and the second supporting leg 252 of the second wall 226b of the second rail 204 will not separate from the first groove 246 of the first supporting base 244a and the second groove 248 of the second supporting base 244b respectively. It is thus ensured that the second rail 204, when mounted in the channel of the third rail 206, will stay securely mounted in the channel of the third rail 206 without being affected by the force (e.g., external force), and that the slide rail assembly 200 is therefore reliable and safe in terms of use.

Figure 17:
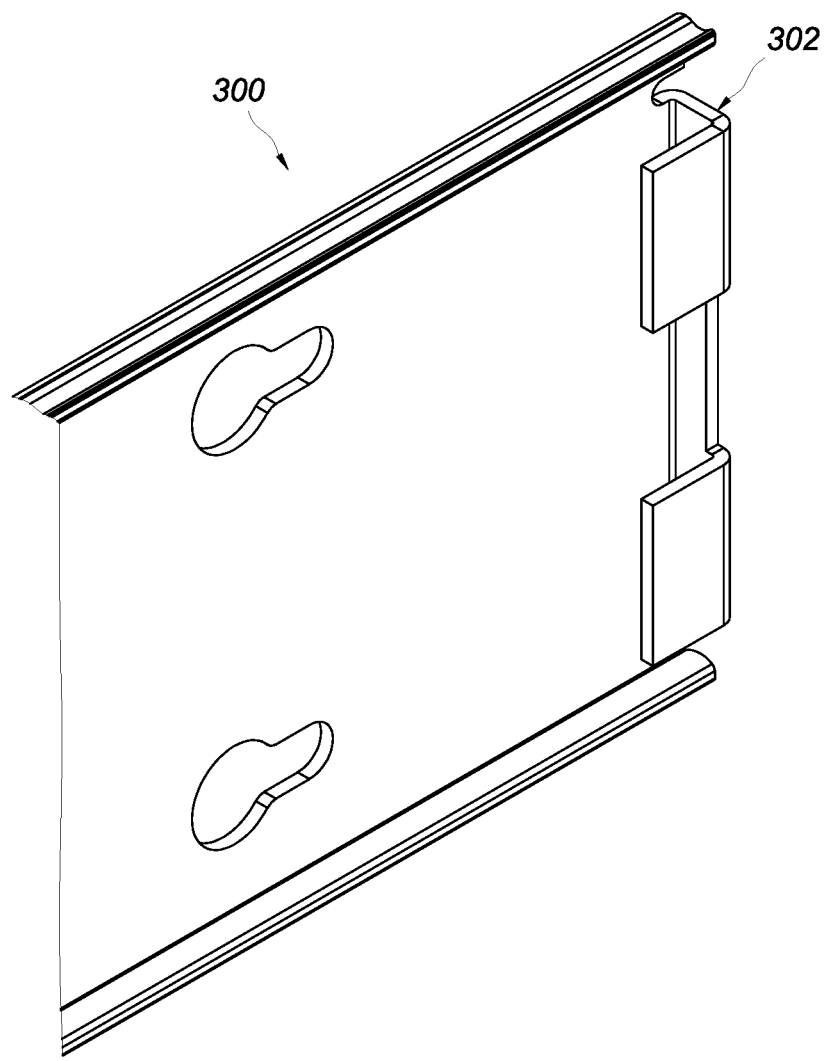
FIG. 17 is a partial perspective view of the second rail in the third embodiment of the present invention.

FIG. 17 shows the second rail 300 in the third embodiment of the present invention. In contrast to the first embodiment, in which the position-limiting member 108 is an additional component attached to the second rail 104, the third embodiment is so designed that the position-limiting member 302 is directly integrated with the second rail 300, i.e., the second rail 300 is directly formed with the position-limiting member 302.

While the present invention has been disclosed through the preferred embodiments described above, it should be understood that the embodiments are not intended to be restrictive of the scope of the invention. The scope of the patent protection sought by the applicant is defined by the appended claims.

What is claimed is:
1. A slide rail assembly, comprising:
  a first rail including a first wall, a second wall, and a longitudinal wall connected between the first wall and the second wall of the first rail;
  a supporting frame extending longitudinally and including an upper supporting portion, a lower supporting portion, and an intermediate supporting portion connected between the upper and lower supporting portions, the upper supporting portion, the lower supporting portion, and the intermediate supporting portion jointly define a channel into which the first rail is received and affixed to the first rail therein, the supporting frame includes a position-limiting feature defined by a notch formed in an end portion of the intermediate supporting portion thereof;
  a second rail including a first wall, a second wall, and a longitudinal wall connected between the first wall and the second wall of the second rail, wherein the second rail is displaceable with respect to the first rail from a retracted position in a first direction; and
  a position-limiting member disposed on the longitudinal wall of the second rail and having a first portion and a second portion, wherein the first portion is substantially perpendicular to the longitudinal wall of the second rail, and the second portion extends substantially perpendicularly from the first portion and is spaced apart from the longitudinal wall of the second rail, a distal end of the first portion adjacent to the second portion being configured to be received within the notch of the intermediate supporting portion;
  wherein responsive to the second rail being at the retracted position with respect to the first rail, the first rail and the second rail are partially embraced by the position-limiting member, and the distal end of the first portion of the position-limiting member is disposed in the notch of the intermediate supporting portion of the supporting frame and the first portion of the position-limiting member is disposed in abutting relationship with a front end portion of the first rail and in correspondence with a front end portion of the second rail, and the second portion of the position-limiting member prevents the first rail and the second rail from separating from each other in a second direction, the first direction and the second direction being substantially perpendicular to each other.

2. The slide rail assembly of claim 1, wherein the notch includes an upper portion, a lower portion, and an intermediate portion; the upper portion, the lower portion, and the intermediate portion jointly define a position-limiting space; and the second portion of the position-limiting member is configured to extend into the position-limiting space and thus enter into a position-limiting relationship with the upper portion, the lower portion, and the intermediate portion of the notch.

3. The slide rail assembly of claim 2, wherein the intermediate portion of the notch is adjacent to the front end portion of the first rail, and the upper and lower portions of the notch extend longitudinally beyond the front end portion of the first rail.

4. The slide rail assembly of claim 1, wherein the upper supporting portion is adjacent to the first wall of the first rail; the lower supporting portion is adjacent to the second wall of the first rail; and the intermediate supporting portion is adjacent to the longitudinal wall of the first rail.

5. The slide rail assembly of claim 1, wherein the position-limiting member is fixedly coupled to the second rail.

6. The slide rail assembly of claim 1, wherein the position-limiting member and the second rail are integrally formed in one-piece formation.

7. The slide rail assembly of claim 1, further comprising a third rail movably mounted between the first rail and the second rail such that the second rail and the third rail are displaceable with respect to the first rail from the retracted position in the first direction, wherein when the second rail and the third rail are at the retracted position, the third rail is partially embraced by the position-limiting member, with the first portion of the position-limiting member being adjacent to a front end portion of the third rail, and the second portion of the position-limiting member preventing the third rail from separating from the first rail in the second direction.

8. The slide rail assembly of claim 7, wherein when the second rail and the third rail reach an extended position after displacement with respect to the first rail from the retracted position, the position-limiting member is located away from the front end portion of the first rail and the front end portion of the third rail.

9. The slide rail assembly of claim 7, further comprising at least one slide-facilitating device, wherein the first rail, the second rail, and the third rail support one another via the at least one slide-facilitating device.

\* \* \* \* \*